(12) United States Patent
Jain et al.

(10) Patent No.: US 10,294,582 B2
(45) Date of Patent: May 21, 2019

(54) METHODS OF GROWING SINGLE CRYSTALS USING SOLID-SOLID TRANSFORMATION OF A GLASS

(71) Applicant: LEHIGH UNIVERSITY, Bethlehem, PA (US)

(72) Inventors: Himanshu Jain, Bethlehem, PA (US); Dmytro Savytskyy, Bethlehem, PA (US); Volkmar Dierolf, Allentown, PA (US)

(73) Assignee: LEHIGH UNIVERSITY, Bethlehem, PA (US)

( * ) Notice: Subject to any disclaimer, the term of this patent is extended or adjusted under 35 U.S.C. 154(b) by 0 days.

(21) Appl. No.: 15/272,982

(22) Filed: Sep. 22, 2016

(65) Prior Publication Data

US 2017/0081777 A1 Mar. 23, 2017

Related U.S. Application Data

(60) Provisional application No. 62/221,888, filed on Sep. 22, 2015.

(51) Int. Cl.
| | |
|---|---|
| *C30B 1/02* | (2006.01) |
| *C30B 29/46* | (2006.01) |
| *C30B 29/12* | (2006.01) |
| *C03B 32/02* | (2006.01) |
| *C30B 29/16* | (2006.01) |

(52) U.S. Cl.
CPC ............. *C30B 1/023* (2013.01); *C03B 32/02* (2013.01); *C30B 29/12* (2013.01); *C30B 29/16* (2013.01); *C30B 29/46* (2013.01)

(58) Field of Classification Search
CPC combination set(s) only.
See application file for complete search history.

(56) References Cited

U.S. PATENT DOCUMENTS

| | | | |
|---|---|---|---|
| 2001/0019014 A1* | 9/2001 | Kubota | C03C 10/00 204/157.41 |
| 2006/0046360 A1* | 3/2006 | Jung | H01L 21/2022 438/149 |
| 2013/0186455 A1* | 7/2013 | Liu | H01L 31/0368 136/255 |

OTHER PUBLICATIONS

Arun, et al., "Laser-induced crystallization in amorphous films of Sb2C3 (C=S, Se, Te), potential optical storage media," 1999, J. Phys. D: Appl. Phys, vol. 32, pp. 183-190.
Arun, et al., "Laser-induced crystallization in Sb2S3 films," 1997, Mat. Res. Bull, vol. 32, No. 7, pp. 907-913.

(Continued)

*Primary Examiner* — Erin F Bergner
(74) *Attorney, Agent, or Firm* — Fisherbroyles, LLP

(57) ABSTRACT

The present invention includes methods of promoting single crystal growth via solid-solid transformation of an appropriate glass, while avoiding the gaseous or liquid phase. In certain embodiments, in the all-solid-state glass-to-crystal transformation of the invention, extraneous nucleation is avoided relative to crystal growth via spatially localized laser heating and optional inclusion of a suitable glass former in the composition. The ability to fabricate patterned single-crystal architecture on a glass surface was demonstrated, providing a new class of micro-structured substrate for low cost epitaxial growth and active planar devices, for example.

23 Claims, 10 Drawing Sheets

(56) References Cited

OTHER PUBLICATIONS

AZoM, "Researchers Demonstrate New Method for Making Single Crystals," AZO Materials, http://www.azom.com/news.aspx?newsID=45358.htm (accessed Dec. 20, 2016).
Gupta, et al., "Laser fabrication of semiconducting ferroelectric single crystal SbSI features on chalcohalide glass," 2011, Opt. Mater. Exp., vol. 1, No. 4, pp. 652-657.
Lehigh University. "Scientists extend the reach of single crystals," R&D Magazine. http://www.rdmag.com/news/2016/03/scientists-extend-reach-single-crystals.htm (accessed Dec. 20, 2016).
Lehigh University. "Scientists extend the reach of single crystals: Researchers see high-tech applications for glasses, other solid materials." ScienceDaily. www.sciencedaily.com/releases/2016/03/160321135528.htm (accessed Dec. 20, 2016).
Savystskii, et al., "Demonstration of single crystal growth via solid-solid transformation of a glass," Scientic Reports 6:23324, 2016, pp. 1-7.

\* cited by examiner

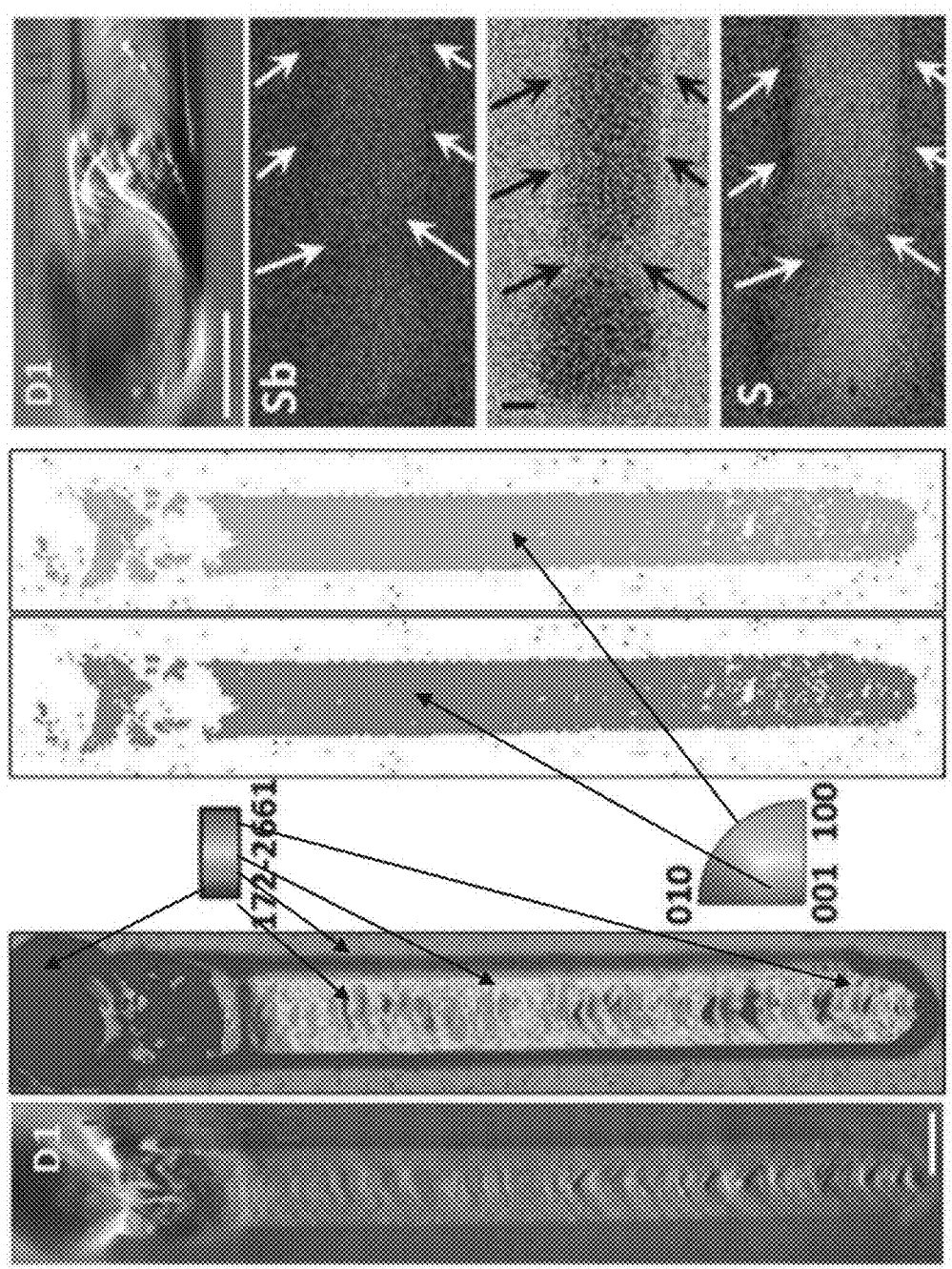

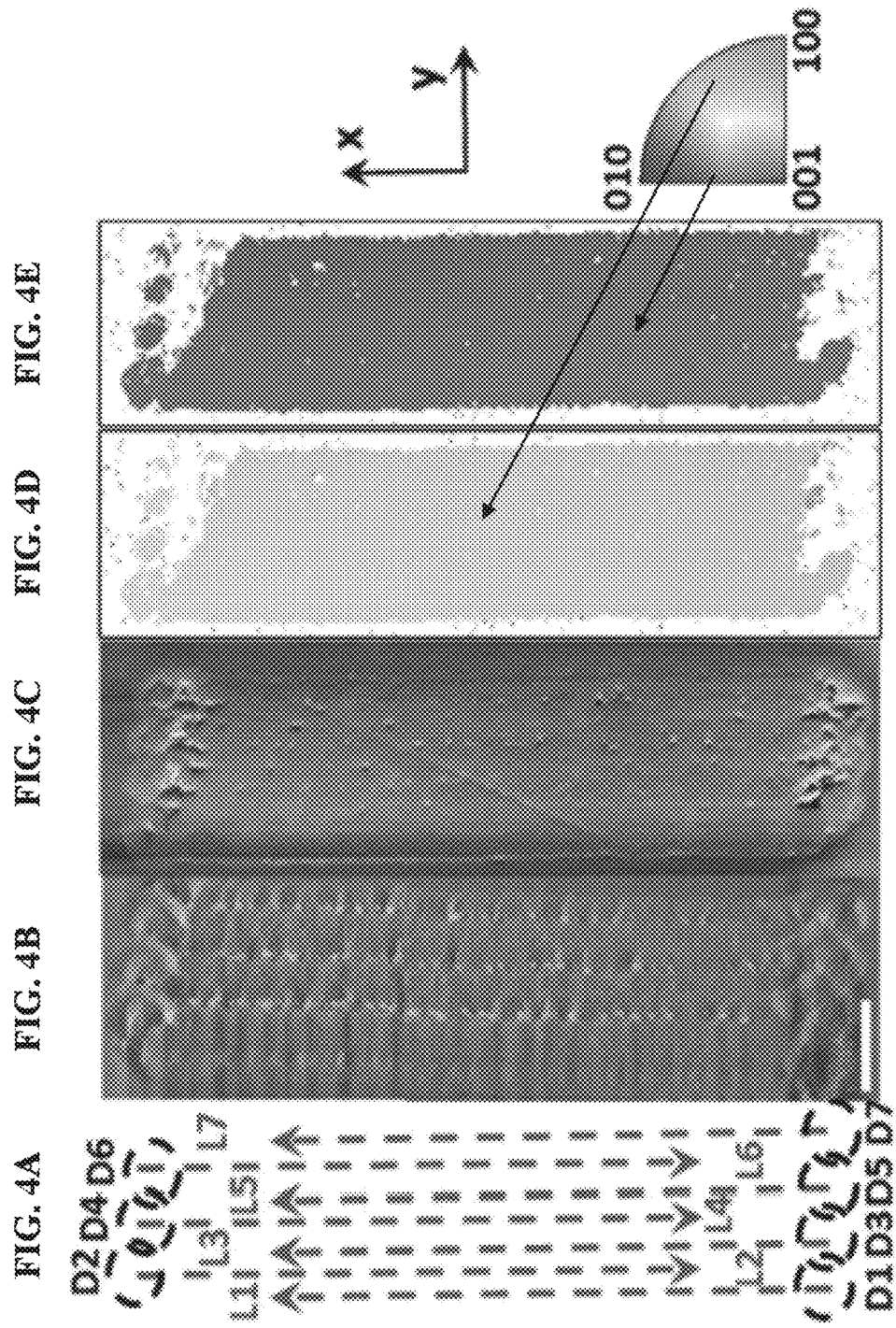

METHODS OF GROWING SINGLE CRYSTALS USING SOLID-SOLID TRANSFORMATION OF A GLASS

CROSS-REFERENCE TO RELATED APPLICATIONS

The present application claims priority to U.S. Provisional Application No. 62/221,888, filed Sep. 22, 2015, the disclosure of which is incorporated herein by reference in its entirety.

STATEMENT REGARDING FEDERALLY SPONSORED RESEARCH OR DEVELOPMENT

This invention was made with government support under grant number DE-SC0005010 awarded by Basic Energy Sciences Division, Department of Energy. The government has certain rights in the invention.

BACKGROUND OF THE INVENTION

Scientifically, the term "glass" is used to designate any solid that possesses a non-crystalline (amorphous) structure at the atomic scale and exhibits a glass transition when heated towards the liquid state. In certain instances, glasses can be transparent. Glasses can be formed from oxides such as silicates (based on silica, also known as silicon dioxide or quartz), non-oxides such as chalcogenides, porcelains, metallic alloys, ionic melts, aqueous solutions, molecular liquids, and thermoplastic polymers. On the other hand, a "ceramic" is an inorganic nonmetallic solid comprising metal, nonmetal or metalloid atoms primarily held in ionic and covalent bonds. The crystallinity of ceramic materials ranges from highly oriented to semi-crystalline, and sometimes completely amorphous (such as in the case of certain glasses).

Inorganic solids generally exist in a disordered glassy, a polycrystalline ceramic, and/or a fully ordered single crystal state. A transformation from glass to ceramic is achieved readily by heating the former to a particular temperature that inevitably leads to nucleation of many crystals. In producing a single crystal, the creation of multiple nuclei must be avoided. For this reason, most single crystals are produced by liquid-to-solid (not solid-to-solid) transformation, in which formation of extraneous nuclei during the growth of the initially formed nucleus is unstable in the surrounding liquid phase.

However, there are serious drawbacks of single crystal growth from melts. Such methods are not useful for fabricating crystals of compositions that decompose, transform to some undesirable phase, or melt incongruently on heating. Consequently, it is extremely difficult or impossible to grow single crystals of many complex oxides, such as high $T_c$ superconductors, and organometallic halide perovskites for solar cells of exceptional efficiency. This lack of high quality crystals is identified as a critical limitation to the progress of materials by design paradigm. For these materials, elevated temperatures and melting need to be avoided.

The concept of glass-to-single crystal transformation has not been achievable in the art due to concurrent nucleation at multiple sites, which ultimately produced polycrystalline glass-ceramic instead of single crystal. Attempts to implement a single crystal architecture in glass (SCAG) fabrication using continuous wave (CW) and femtosecond (fs) lasers led to formation of a single crystal during cooling of molten material that is produced in the vicinity of the laser focus. This process does not have the desired advantages of a solid-state transformation of glass-to-single crystal, and very much resembles the traditional floating zone crystal growth from the melt.

There is thus a need in the art for novel methods of promoting single crystal growth via solid-solid transformation of an appropriate glass. The present invention addresses this need.

BRIEF SUMMARY OF THE INVENTION

The invention provides methods of growing a single crystal in a glass. The invention further provides methods of growing a two-dimensional single crystal in a glass. The invention further provides apparatuses for growing a single crystal in a glass.

In certain embodiments, the method comprises irradiating a first section of the glass with a laser beam. In other embodiments, irradiating with the laser beam heats the first section of the glass to about the glass's crystallization onset temperature ($T_x$). In yet other embodiments, glass in the first section is converted to a single crystal.

In certain embodiments, the first section of the glass remains a solid while being irradiated with the laser beam.

In certain embodiments, the glass melts incongruently. In other embodiments, the glass does not melt incongruently.

In certain embodiments, the glass comprises a component that evaporates at a temperature higher than $T_x$. In other embodiments, the glass does not comprise a component that evaporates at a temperature higher than $T_x$.

In certain embodiments, the glass decomposes upon heating to its melting temperature ($T_m$). In other embodiments, the glass does not decompose upon heating to its melting temperature ($T_m$).

In certain embodiments, the single crystal is unstable at temperatures between $T_x$ and $T_m$. In other embodiments, the single crystal is unstable at temperatures between $T_x$ and $T_m$.

In certain embodiments, the single crystal undergoes phase transformation at temperatures between $T_x$ and $T_m$. In other embodiments, the single crystal undergoes phase transformation at temperatures between $T_x$ and $T_m$.

In certain embodiments, the first section has a diameter that is selected so that only one single crystal is formed in the first section upon laser irradiation.

In certain embodiments, the first section has a diameter ranging from about 0.5 µm to about 1 mm.

In certain embodiments, the laser beam has a power density ranging from about 10 µW/µm² to about 1 W/µm².

In certain embodiments, irradiation of the first section by the laser beam ceases as soon as the single crystal forms in the first section.

In certain embodiments, the position of the laser beam with respect to the glass is changed, so that the laser beam irradiates a second section of the glass, wherein the second section overlaps partially with the first section, wherein irradiating with the laser beam heats the second section to about the glass's $T_x$, and wherein glass in the second section is converted to a single crystal.

In certain embodiments, a single crystal is formed in a sub-section that lies within the combination of the first and second sections.

In certain embodiments, the laser beam penetrates the glass to a depth equal to or greater than 1 µm.

In certain embodiments, the glass comprises at least one selected from the group consisting of chalcogenide glasses, oxide glasses, metallic glasses, and thermoplastic polymers.

In certain embodiments, the glass comprises an $A_2B_3$ type chalcogenide, wherein 'A' comprises at least one selected from the group consisting of As, Sb and Bi, and 'B' comprises at least one selected from the group consisting of S, Se and Te.

In certain embodiments, the glass comprises $Sb_2S_3$.

In certain embodiments, the glass further comprises a glass-forming component. In other embodiments, the glass-forming component comprises at least one selected from the group consisting of $SiO_2$, $B_2O_3$, $GeO_2$, $As_2S_3$, $GeS_2$, $GeSe_2$, $As_2Se_3$, and $SbI_3$.

In certain embodiments, the method comprises irradiating a first initial section of the glass with a laser beam, wherein the irradiated first initial section heats to about the glass's crystallization onset temperature ($T_x$), whereby a single crystal is formed in the first initial section.

In certain embodiments, the method further comprises reorienting the laser beam in relation to the glass, so that the laser irradiates a first final section of the glass, whereby inbetween irradiating the first initial and first final sections the laser sequentially irradiates a first plurality of intermediate sections of the glass. In other embodiments, each of the first plurality of intermediate sections is irradiated with the laser beam so that it is heated to about the glass's $T_x$, wherein glass in each of the first plurality of intermediate sections is converted to a single crystal. In yet other embodiments, each of the first plurality of intermediate sections independently partially overlaps with the intermediate section that immediately precedes and the intermediate section that immediately succeeds it in the first plurality of intermediate sections. In yet other embodiments, the last section in the first plurality of intermediate sections overlaps with the first final section. In yet other embodiments, a single crystal is formed in a first sub-section comprised within the combination of the first initial section, each of the first plurality of intermediate sections and first final section of glass.

In certain embodiments, the method further comprises reorienting the laser beam in relation to the glass, so that the laser irradiates a second final section of the glass, whereby inbetween irradiating the first final and second final sections the laser sequentially irradiates a second plurality of intermediate sections of the glass. In other embodiments, each of the second plurality of intermediate sections is irradiated with the laser beam so that it is heated to about the glass's $T_x$, wherein glass in each of the second plurality of intermediate sections is converted to a single crystal. In yet other embodiments, each of the second plurality of intermediate sections independently partially overlaps with the intermediate section that immediately precedes and the intermediate section that immediately succeeds it in the second plurality of intermediate sections. In yet other embodiments, the last section in the second plurality of intermediate sections overlaps with the second final section. In yet other embodiments, a single crystal is formed in a second sub-section comprised within the combination of the first final section, each of second plurality of intermediate sections and second final section of glass. In yet other embodiments, at least one of the first plurality of intermediate sections overlaps with at least one of the second plurality of intermediate sections. In yet other embodiments, the first sub-section overlaps partially with the second sub-section. In yet other embodiments, a two-dimensional single crystal is formed in the glass.

In certain embodiments, the two-dimensional single crystal spans on the glass a continuous surface that is substantially free of non-crystalline material.

In certain embodiments, the apparatus comprises a computer system. In other embodiments, the apparatus further comprises a laser that emits a laser beam of given power, wherein the given power is adjustable and controlled by the computer system in real time. In yet other embodiments, the apparatus further comprises a holder for the glass, wherein the translation of the holder in x-, y- and z-directions is controlled by the computer system in real time. In yet other embodiments, the apparatus further comprises a microscope objective that allows for focusing the laser beam onto the glass. In yet other embodiments, the apparatus further comprises a monitoring system for monitoring the glass in real time.

In certain embodiments, the apparatus comprises the apparatus allows for irradiating a first section of the glass with the laser beam, whereby the first section is heated to about the glass's crystallization onset temperature ($T_x$). In other embodiments, when the monitoring system detects formation of a single crystal in the first section of the glass, the computer system ceases irradiation of the first section by the laser beam. In yet other embodiments, the computer system changes the position of the laser beam with respect to the glass, so that the laser beam irradiates a second section of the glass, wherein the second section overlaps partially with the first section, wherein irradiating with the laser beam heats the second section to about the glass's $T_x$, and wherein glass in the second section is converted to a single crystal. In yet other embodiments, the monitoring system comprises a scanning electron microscope. In yet other embodiments, the scanning electron microscope comprises an electron backscatter diffraction detector.

Compositions, devices and methods defined by the invention were isolated or otherwise manufactured in connection with the examples provided below. Other features and advantages of the invention will be apparent from the detailed description and claims.

BRIEF DESCRIPTION OF THE DRAWINGS

The following detailed description of various embodiments of the invention will be better understood when read in conjunction with the appended drawings. For the purpose of illustrating the invention, certain embodiments are shown in the drawings. It should be understood, however, that the invention is not limited to the precise arrangements and instrumentalities of the embodiments shown in the drawings.

FIG. 1A: Prototypical temperature dependence vs. nucleation and growth rate curves. FIG. 1B: Schematic of the laser induced temperature fields in the focal spot at the glass surface, with the temperature lines from FIG. 1A representing the lower limits of nucleation and crystal growth temperature range. Small rhombuses indicate the region of unwanted nuclei, while larger rhombus indicates the region of single crystal formation. $T_m$, $T_x$, $T_n$ and $T_g$ indicate the temperatures of melting, crystal growth onset, nucleation onset and glass transition.

FIG. 2A: SEM image. FIG. 2B: (left) colored IQ map, and orientation IPF maps with reference vector along surface normal (center) and along in-plane direction (right), respectively. EBSD mapping was collected using 70°-inclined geometry, which in the case of rough sample surface results in a "shadow" region inaccessible to the probe electron beam. The white-colored regions on IPF maps inside of the dot correspond to such "shadow" regions.

FIGS. 3A-3E comprise a series of images illustrating an exemplary laser-induced formation of $Sb_2S_3$ single crystal line on the surface of $16SbI_3$-$84Sb_2S_3$ glass. A single-crystal dot (D1) was created by slowly ramping the power density from 0 to 90 µW/µm$^2$ in 5 s, followed by steady exposure for 60 s. Scale bar corresponds to 5 µm. (FIG. 3A) SEM image, (FIG. 3B) IQ and colored orientation IPF maps with reference vectors (FIG. 3C) along surface normal and (FIG. 3D) an in-plane direction for the single-crystal line; (FIG. 3E) SEM image and EDS color maps for sulfur, iodine and antimony in the dot D1→line L1 transition region. The rough sample surface in part of the dot and beginning of the line did not show an EBSD signal due to the "shadow" effect for the probe electron beam.

FIGS. 4A-4E comprise a series of images illustrating an exemplary 2D laser-induced single-crystal architecture fabricated by "stitching" seven lines, L1-L7. First, a seed dot D1 and line L1 were created on the surface of $16SbI_3$-$84Sb_2S_3$ glass, as in FIGS. 3A-3E. New seed dots (D2-D7) were formed from previous lines, and then used to grow new lines (L2-L7), correspondingly. To form dots D2-D7 the beam was shifted laterally in the y-direction by 3 µm and the exposure was reduced to 15 s. (FIG. 4A) Plan-view; SEM images (FIG. 4B) before and (FIG. 4C) after repolishing; and orientation IPF maps with reference vectors (FIG. 4D) along surface normal and (FIG. 4E) the in-plane direction, respectively. Scale bar corresponds to 10 µm.

DETAILED DESCRIPTION OF THE INVENTION

In one aspect, the present invention contemplates a strategy in which the glassy material is heated locally by a laser to just its crystallization temperature ($T_x$), which is well below the melting temperature. Using glass as a precursor, and a focused laser as a localized heating source, the methods of the invention offer the combined advantages of low cost, access to broad composition ranges, and easy formability of single crystals in complex shapes including wires or films. Furthermore, this strategy enables a new materials platform comprising of a single crystal architecture in glass (SCAG), in which the single crystal of arbitrary shape can be an active phase with properties (such as, but not limited to, second order optical nonlinearity, ferroelectricity, pyroelectricity, and piezoelectricity) that are not possible in the isotropic structure of glass. Consequently, this method for converting glass to single crystal can have a transformational impact on multiple technologies.

There is no record in the prior art of successful all solid-state conversion of bulk solid glass to a single crystal. The single crystal growth that occurs directly from solid glass offers the possibility of SCAG for crystal compositions that melt incongruently, decompose on heating to the melting temperature ($T_m$), or for which the desired crystalline phase is unstable at temperatures between $T_x$ and $T_m$. In one non-limiting aspect, a glass-to-single crystal transformation can be achieved by establishing a single nucleus and then helping it grow to the desired dimensions. In certain embodiments, the required experimental conditions inhibit the formation of any other competing nuclei while the initially nucleated crystal grows.

In certain cases, single crystal growth can be accomplished by destabilizing nucleation in the vicinity of the growing crystal by maintaining the temperature slightly below $T_m$, in the metastable Ostwald-Miers supercooled zone. In this temperature range no nucleation occurs (FIG. 1A), and an external seed crystal is utilized. On the other hand, when one relies on spontaneous nucleation (such as in the case of glass devitrification), multiple crystals grow simultaneously resulting in a polycrystalline ceramic. Since the temperature of nucleation onset ($T_n$) is always lower than $T_x$, unwanted nuclei are always likely to form and remain stable around the heated region as shown schematically in FIGS. 1A-1B.

Figure 1A:
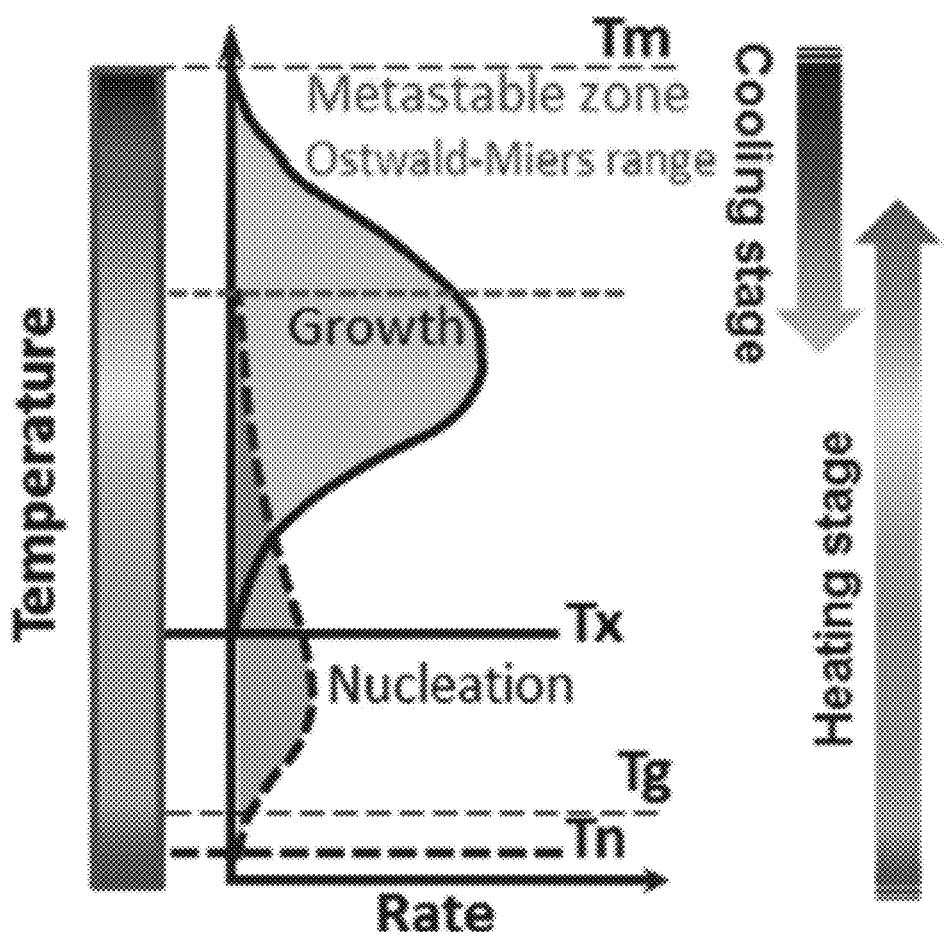
FIGS. 1A-1B comprise a series of images illustrating temperature dependence of nucleation and crystal growth rates in glass-forming systems and its relationship to laser crystallization.
Figure 1B:
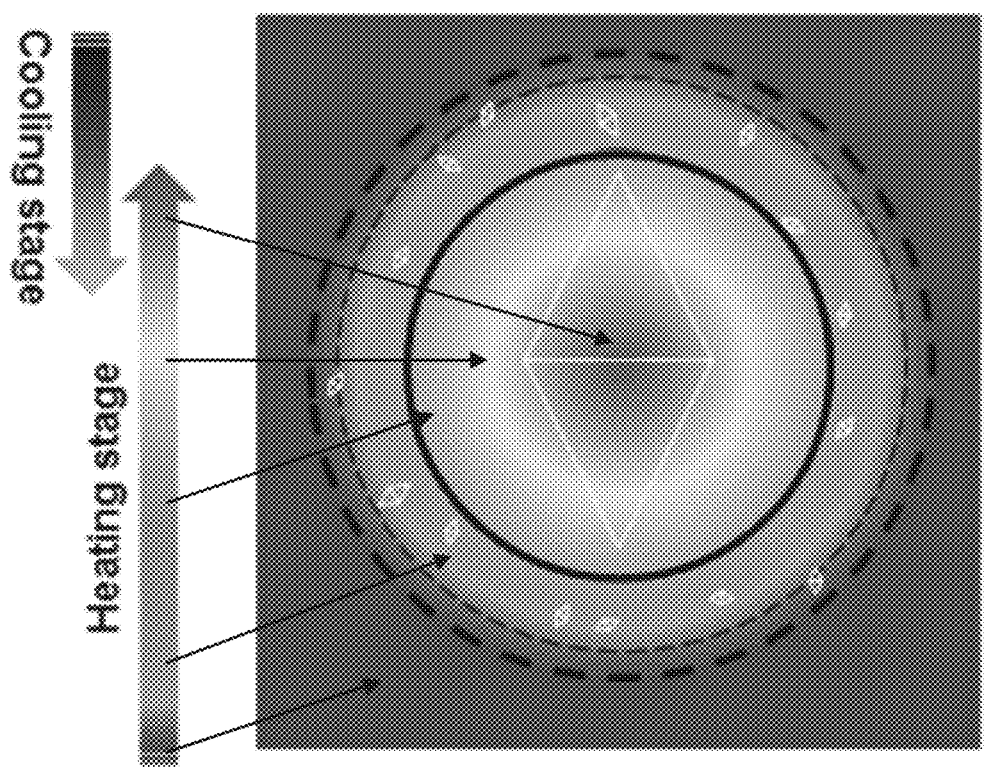

In certain embodiments, the methods of the invention allows for growing a single crystal using direct crystallization of glass, which involves heating it from ambient to $T_x$ (FIGS. 1A-1B). Nucleation is a stochastic process, so that its overall probability depends on the volume of the heated region and the time. Heating with a focused laser can limit the volume of glass, so that only one nucleus is allowed to form, which is then grown quickly into a single crystal. In other embodiments, unwanted additional nucleation can be avoided by decreasing the volume of the heated region and growing the crystal by moving the laser beam at a sufficiently fast rate such that there is no time for forming extraneous crystals.

To validate the strategy contemplated in the present invention and demonstrate proof-of-concept, one can begin with a composition that is within the glass-forming region but not too far from the boundary where crystallization is unavoidable. If the glass is highly stable, the probability of nucleation, especially homogeneous nucleation, and hence controlled laser crystallization is too low to test the hypothesis in a reasonable time. On the other hand, if the composition crystallizes too easily, precise observation of the crystallization process, especially single-crystal formation, would become difficult. Further, for experimental convenience the glass should be able to absorb readily available laser light in a sufficiently deep region of the sample. In certain embodiments, a laser that is strongly absorbed just in the very top surface layer (<1 µm) is not desirable, as the nucleation becomes relatively improbable and the crystal growth is not as well controlled. The bandgap of most chalcogenide glasses falls into the visible to near-infrared spectral region, so that light from red lasers is absorbed efficiently and no additional dopants are required in contrast to oxide glasses. Changing the wavelength of the laser allows altering the corresponding absorption cross-section conveniently, which would facilitate modification of the temperature profile within the sample, providing a useful tool for optimizing crystal nucleation/growth dynamics.

As demonstrated, $Sb_2S_3$ composition was used as a test example. This simple binary composition belongs to technologically important $A_2B_3$ type chalcogenides (A is selected from As, Sb and Bi; B is selected from S, Se and Te), which have been investigated due to their attractive physical and chemical properties. Consequently, their basic physical, thermodynamic and chemical properties have been determined and are readily available in the literature. Among possible choices, antimony trisulfide ($Sb_2S_3$) is attractive because of its interesting ferroelectric properties and potential practical applications in solar cells, microwave devices, switching sensors, thermoelectric and optoelectronic devices. To exemplify the impact of the strategy of single crystal fabrication, this material burns in air at about 300° C., and loses sulfur preferentially upon heating to high temperature in an inert atmosphere. Therefore, it is practically impossible to obtain its stoichiometric single crystal by starting from melt using conventional methods.

Previous attempts of crystallization of amorphous $Sb_2S_3$ films, which did not follow the presently recited strategy, produced only polycrystalline structures (Arun, et al., 1997, Mat. Res. Bull. 32:907-913; Arun, et al., 1999, J. Phys. D: Appl. Phys. 32:183-190). In those studies, argon laser with a spot size of 400 μm diameter was used, and no attempt was made to maintain the temperature below the melting temperature. $Sb_2S_3$ does not form glass easily, requiring very rapid cooling of the melt to form bulk glass, or vacuum deposition of its vapor phase to form thin amorphous films. Thus, in those prior art reports the probability of extraneous nucleation was too high to yield a single-crystal upon heating.

Several independent key observations show that the methods of the invention allow for the glass-to-single crystal transformation to occur entirely in the solid state. In one aspect, scratches that were present on the glass surface before laser irradiation (FIG. 2B, center and right, most clearly in the region of the line) persist through the crystallization process, indicating that the nucleation and growth processes occur without forming a melt that would have altered the surface morphology. In another aspect, the in situ observation of the crystal growth process demonstrates that the crystallization occurs at the leading, not the trailing edge of the laser beam. The former region represents the region being heated from ambient to crystallization temperature, while the latter represents the region cooled to ambient from the crystallization temperature. This is a direct indication that the glass transforms into single crystal upon its heating, and not during the cooling of the melt that would have happened at the trailing edge of the laser spot. Thus, these results demonstrate the transformation of a glass into single-crystal by heating to crystallization onset temperature ($T_x$), rather than by the usual crystal growth processes via cooling to the crystallization temperature from above the melting point (FIG. 1).

As for the lines fabricated in $Sb_2S_3$ glass, the crystallization also occurs at the leading edge of the laser-heated region confirms the growth of single-crystal $Sb_2S_3$ line by the solid state transformation of $16SbI_3$-$84\ Sb_2S_3$ glass during heating. The relatively small volume contraction of the line compared to the initial dot in FIGS. 3A-3E suggests that the crystal growth occurs by the redistribution of Sb, S and I atoms during growth rather than evaporation of $SbI_3$. The same is also indicated by the depletion of S and enrichment of I just outside the line (arrows in FIG. 3E). In conclusion, the present results demonstrate that it is feasible to fabricate SCAG via a completely solid-state transformation. Successful examples of 1D and 2D $Sb_2S_3$ single-crystal structures are produced on the surface of $xSbI_3$-$(1-x)\ Sb_2S_3$ glass by employing a strategy that relies on eliminating extraneous nucleation relative to crystal growth via space localized laser heating below $T_m$, and adding suitable glass former or nucleation suppressant. The methods of the invention allows for obtaining single crystals that may decompose, melt incongruently or undergo phase transformation between the crystallization and melting temperature of the glass.

Definitions

Unless defined otherwise, all technical and scientific terms used herein generally have the same meaning as commonly understood by one of ordinary skill in the art to which this invention belongs. Generally, the nomenclature used herein and the laboratory procedures in chemistry are those well-known and commonly employed in the art.

As used herein, the articles "a" and "an" refer to one or to more than one (i.e. to at least one) of the grammatical object of the article. By way of example, "an element" means one element or more than one element.

As used herein, the term "about" will be understood by persons of ordinary skill in the art and will vary to some extent on the context in which it is used. As used herein when referring to a measurable value such as an amount, a temporal duration, and the like, the term "about" is meant to encompass variations of ±20% or ±10%, more preferably ±5%, even more preferably ±1%, and still more preferably ±0.1% from the specified value, as such variations are appropriate to perform the disclosed methods.

As used herein, the term "CW" refers to continuous wave.

As used herein, the term "DSC" refers to differential scanning calorimetry.

As used herein, the term "EBSD" refers to electron backscatter diffraction.

As used herein, the term "EDS" refers to energy dispersive X-ray spectroscopy.

As used herein, the term "glass-forming component" refers to a material that forms glass on its own, suppresses unwanted nucleation and/or facilitates glass formation. Non-limiting examples of glass-forming components include $SiO_2$, $B_2O_3$, $GeO_2$, $As_2S_3$, $GeS_2$, $GeSe_2$, $As_2Se_3$, $SbI_3$ (which cannot form glass by itself, but yet promotes formation of $Sb_2S_3$ based glass), and so forth.

As used herein, the term "instructional material" includes a publication, a recording, a diagram, or any other medium of expression that may be used to communicate the usefulness of the compositions, devices and methods of the invention. In some instances, the instructional material may be part of a kit useful for performing the methods of the invention. The instructional material of the kit may, for example, be affixed to a container that contains compositions or devices useful within the methods of the invention or be shipped together with a container that contains such compositions or devices. Alternatively, the instructional material may be shipped separately from the container with the intention that the recipient uses the instructional material and the compositions or devices cooperatively.

As used herein, the term "IPF" refers to inverse pole figure.

As used herein, the term "IQ" refers to image quality.

As used herein, the term "SCAG" refers to single crystal architecture in glass.

As used herein, the term "SEM" refers to scanning electron microscope.

As used herein, the term "single crystal" or "monocrystalline solid" as relating to a sample refers to a material in which the crystal lattice of the entire sample is continuous and unbroken to the edges of the sample.

When not otherwise stated, the term "substantially" means being largely, but not wholly, that which is specified.

As used herein, the term "$T_m$" refers to the temperature of melting of the crystal.

As used herein, the term "$T_x$" refers effectively to the temperature of crystal growth onset.

As used herein, the term "$T_n$" refers effectively to the temperature of crystal nucleation onset.

As used herein, the term "$T_g$" refers to the temperature of glass transition.

As used herein, the term "XRD" refers to X-ray powder diffraction.

Throughout this disclosure, various aspects of the invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range and, when appropriate, partial integers of the numerical values within ranges. For example, description of a range such as from 1 to 6 should be considered to have specifically disclosed sub-ranges such as from 1 to 3 from 1 to 4 from 1 to 5 from 2 to 4 from 2 to 6 from 3 to 6 etc., as well as individual numbers within that range, for example, 1, 2, 2.7, 3, 4, 5, 5.3 and 6. This applies regardless of the breadth of the range.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in its respective testing measurements.

It is to be understood that wherever values and ranges are provided herein, all values and ranges encompassed by these values and ranges, are meant to be encompassed within the scope of the present invention. Moreover, all values that fall within these ranges, as well as the upper or lower limits of a range of values, are also contemplated by the present application.

Those skilled in the art will recognize, or be able to ascertain using no more than routine experimentation, numerous equivalents to the specific procedures, embodiments, claims, and examples described herein. Such equivalents are considered to be within the scope of this invention and covered by the claims appended hereto. For example, it should be understood that modifications in reaction conditions, including but not limited to reaction times, reaction size/volume, and experimental reagents, such as solvents, catalysts, pressures, atmospheric conditions, e.g., nitrogen atmosphere, and reducing/oxidizing agents, with art-recognized alternatives and using no more than routine experimentation, are within the scope of the present application.

The following examples further illustrate aspects of the present invention. However, they are in no way a limitation of the teachings or disclosure of the present invention as set forth herein.

EXAMPLES

The invention is now described with reference to the following Examples. These Examples are provided for the purpose of illustration only, and the invention is not limited to these Examples, but rather encompasses all variations that are evident as a result of the teachings provided herein.

Materials and Methods

Glass Preparation

The glasses were made following the ampule quenching method previously developed for the Sb—S—I system (Gupta, et al., 2011, Opt. Mater. Exp. 1:652-657). To make $Sb_2S_3$ samples, which does not form glass easily, the melt cooling rate was increased by limiting quartz ampules to 1 mm inside diameter (ID) and 10 μm wall thickness. $16SbI_3$-$84Sb_2Sb_3$ glass was prepared using ampules with 11 mm ID and wall thickness 1 mm. X-ray diffraction analysis of the as-quenched samples confirmed their amorphous state. For details of glass fabrication and its characterization, see FIGS. 5A-5B, 6 and 7. The samples for laser-induced treatments were polished using metallographic techniques.

Laser-induced Crystallization

Figure 8:
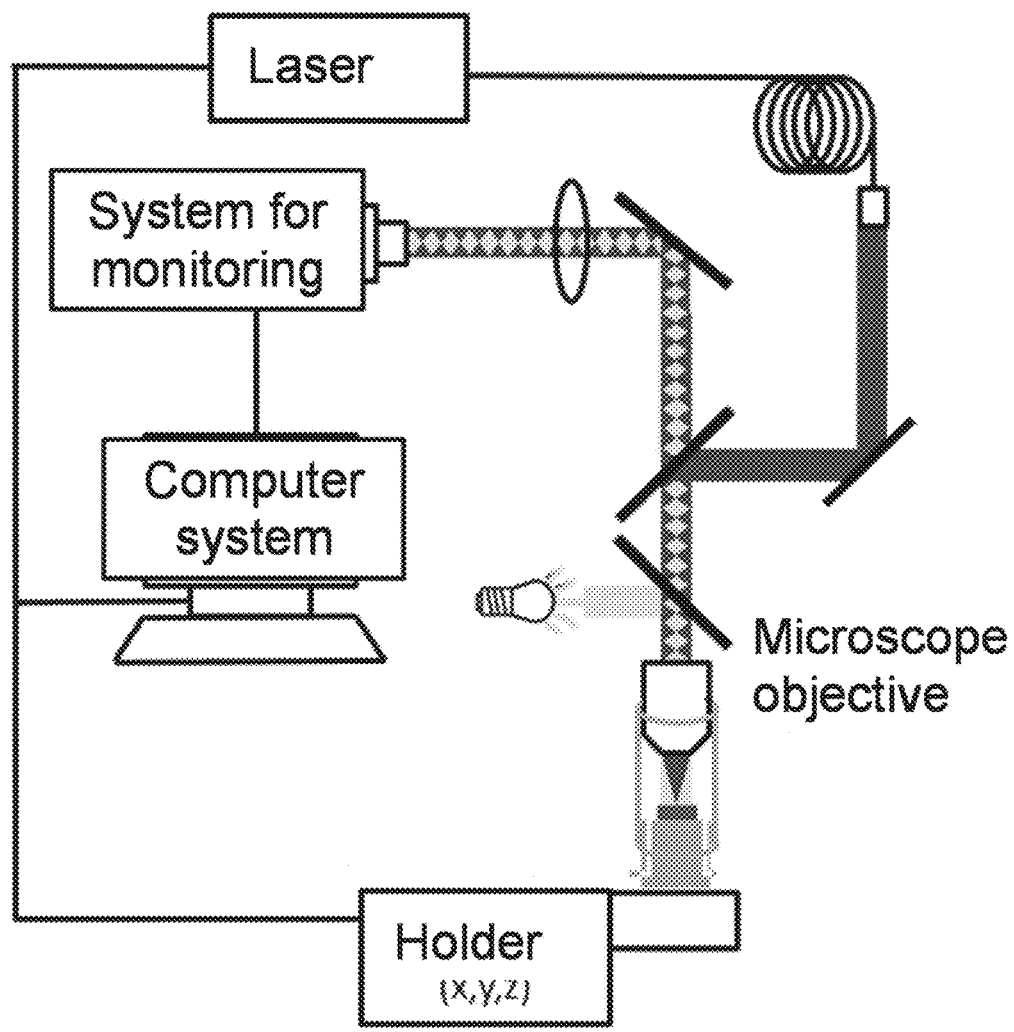
FIG. 8 is an image illustrating a non-limiting laser crystallization setup of the present invention.

The intensity of the fiber-coupled 639 nm diode laser (LP639-SF70, ThorLabs) used for crystallization was modulated by an analog voltage (ILX Lightwave LDX-3545 Precision Current Source). The beam was focused onto the sample by a 50×, 0.75 NA microscope objective. The sample was placed in a flowing nitrogen environment on a custom-built stage, which could be translated independently in the x-, y-, and z-directions. Flow of nitrogen eliminated oxidation of $Sb_2S_3$ crystals, which was observed in air environment. A charge-coupled device (CCD) camera monitored the sample in-situ, while LabView software controlled the laser intensity, and the movement of the stage. A detailed description of laser crystallization system is illustrated in FIG. 8.

Materials Characterization

The laser-irradiated regions were analyzed by a scanning electron microscope (SEM, Hitachi 4300 SE) in water vapor environment to eliminate charging effects. The chemical compositions were determined at multiple locations on each sample by EDS detector attached to SEM, using the EDAX-Genesis software. Local crystallinity and orientation were determined by EBSD with Kikuchi patterns collected by a Hikari detector within the SEM column. EBSD pattern scans were collected and indexed using TSL OIM Data Collection software, whereas Orientation Imaging Microscopy Analysis software yielded image quality, pole figure and inverse pole figure maps (Orientation Imaging Microscopy (OIM™) Data Analysis, 2016, www dot edax dot com/Products/EBSD/OIM-Data-Analysis-Microstructure-Analysis dot aspx.

Preparation of $Sb_2S_3$ Glass Sample

Figure 5A:
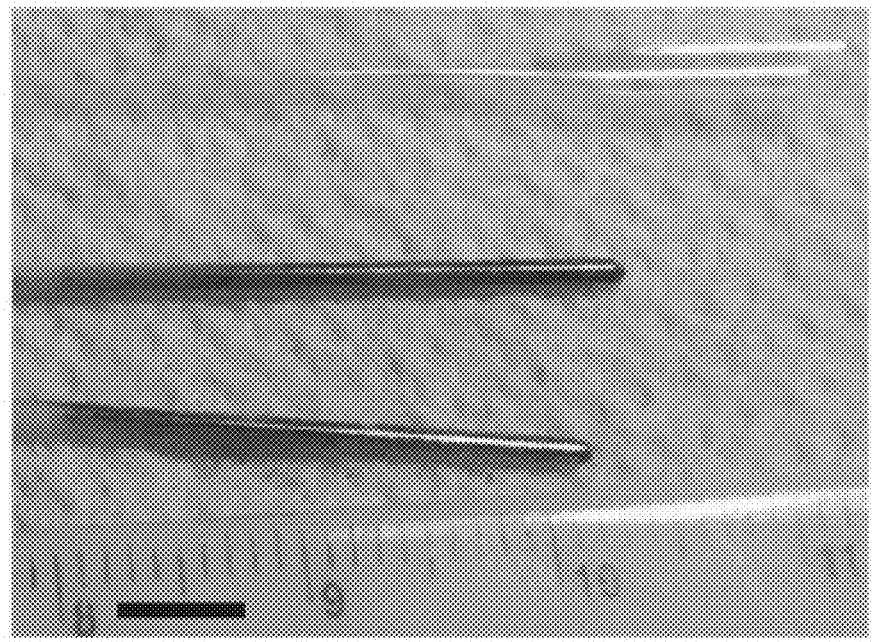
FIGS. 5A-5B comprise a series of images illustrating $Sb_2S_3$ glass, (FIG. 5A) as synthesized in ampule and (FIG. 5B) after polishing. Scale bars correspond to 5 and 0.5 mm, correspondingly.
Figure 5B:

To obtain fast cooling rates, which are necessary for stoichiometric $Sb_2S_3$ glasses located outside the normal glass-forming region of the Sb—S—I system, the inner diameter of the ampoules was reduced to 1 mm. The batch of elemental powders was heated to 730° C. and held for 12 h. Then the ampoules containing reacted melt were slowly cooled to 650° C. and quenched in cold water to form glass (FIG. 5A). The sample together with ampoule was glued to SEM holder and then grinded and polished with grit sizes down to 0.1 μm directly on this holder (FIG. 5B). X-ray powder diffraction (XRD) analysis of the as-quenched glasses confirmed their amorphous state.

Crystallization Propensity

Figure 6:
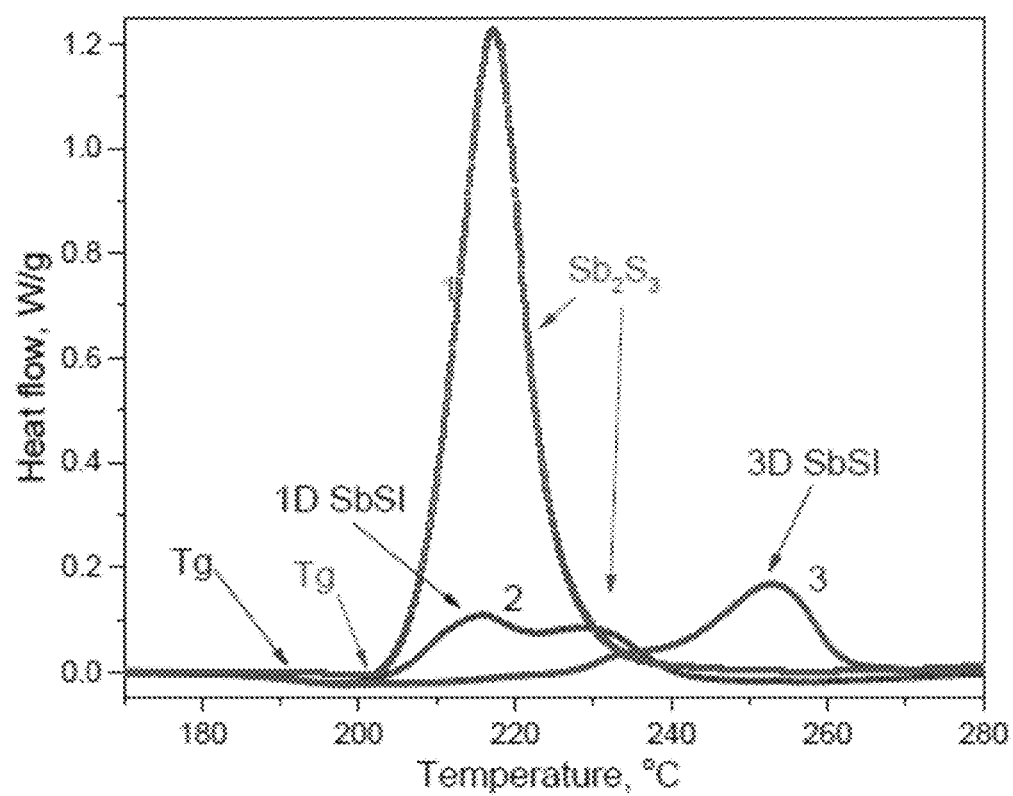
FIG. 6 comprises a graph illustrating DSC data collected at 10 K/min heating rate on (1) $Sb_2S_3$ and (2) $16SbI_3$-$84Sb_2S_3$ glass powders of particle size 0.06-0.18 mm. The data for $16SbI_3$-$84Sb_2S_3$ glass powder of particle size 0.5-0.7 mm and collected at 3 K/min heating rate is plot 3.
Figure 7:
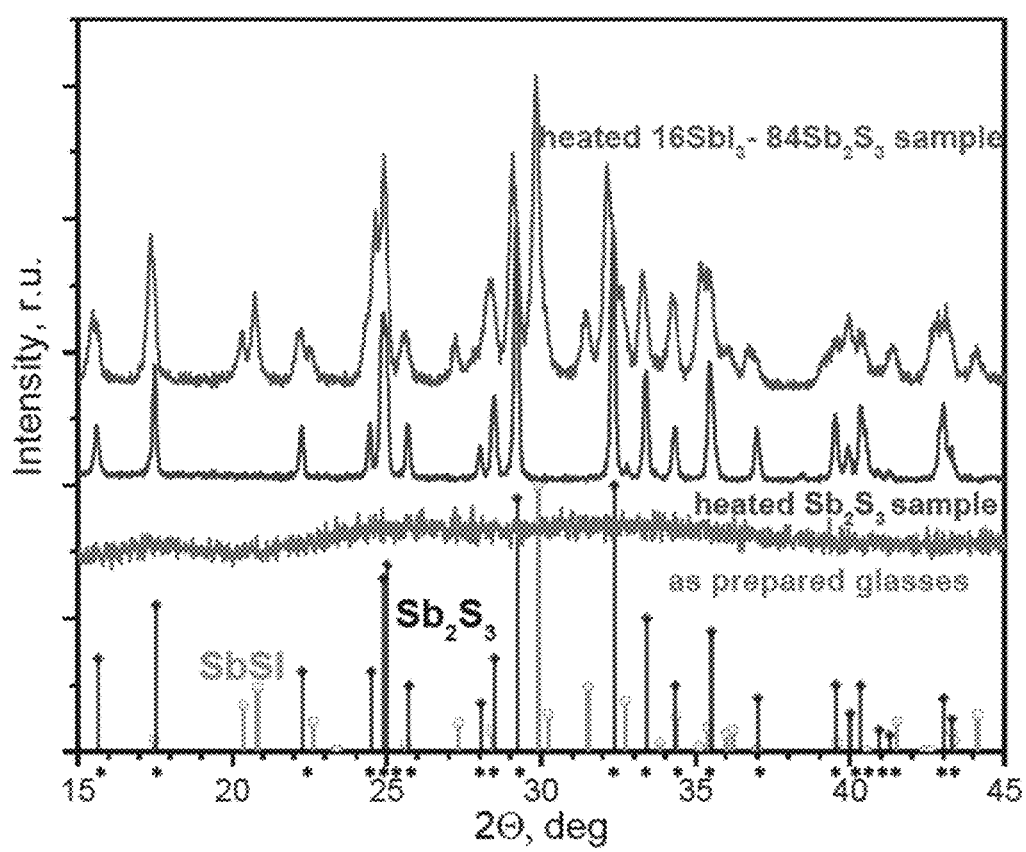
FIG. 7 comprises illustrative X-ray powder diffraction patterns for as-prepared glass and after heating to 300° C. Vertical lines correspond to reflection positions for crystalline $Sb_2S_3$ (black/dark gray in black & white representation; marked with a "*") and SbSI (green/light grey in black & white representation). According to ICCD database, card #00-006-0474, space group for $Sb_2S_3$ is Pbnm (62) with lattice parameters: a=11.229; b=11.310; c=0.3839 nm; for crystalline SbSI, the space group is Pnma (62) with lattice parameters: a=0.8533; b=1.0147; c=0.4107 nm.

The exothermal peak in differential scanning calorimetry (DSC) measurements on the $Sb_2S_3$ glass powder with average size 0.06-0.18 mm established crystallization rate maximum at about 217° C. The DSC plot for the powder heated at 10K/min is shown in FIG. 6. The trace for particles shows only one strong exothermal peak at a temperature close to $T_g$. Apart from $Sb_2S_3$, no other crystalline phase was detected in XRD patterns for the sample after DSC measurements (FIG. 7). Two partially overlapping DSC peaks (approximately at about 215° C. and about 230° C.) were observed for the $16SbI_3$-$84Sb_2S_3$ glass powder with 0.06-0.18 mm size particles at low heating rate 3K/min. For glass particles with 0.5-0.7 mm size, the low temperature peak at about 215° C. disappeared, but another peak appeared in the high temperature range at about 255° C. (FIG. 6). Only one (but wide) DSC peak was observed for powders with different particle sizes when using high heating rate—10K/min. Similar to the stoichiometric SbSI glass, the SbSI phase in the present composition forms by two parallel (1D and 3D) crystallization mechanisms. In contrast to SbSI phase, the temperature of crystallization of $Sb_2S_3$ phase does not depend on the size of the glass particles. Then for the $16SbI_3$-$84Sb_2S_3$ glass, the peak at about 230° C. can be assigned to crystallization of $Sb_2S_3$ phase.

The schematic arrangement of laser writing system is shown in FIG. 8. As the 639 nm light was absorbed by the surface layer of the glass, the spot temperature strongly depended on the power density, which could be manipulated by adjusting the laser intensity, as well as the focus position of the laser beam with respect to the sample surface. The laser beam was defocused relative to the polished surface of the glass sample such that the irradiated area was 7 μm in diameter. Under this condition, the crystalline dots were formed by slowly ramping the power density from zero to 20-105 μW/μm² over a period of 5 seconds. Upon reaching the desired power density, the laser was held at the same power for an additional time.

In certain embodiments, the methods of the invention allow for laser-induced formation of $Sb_2S_3$ single crystal dot and line on the surface of $Sb_2S_3$ glass. A laser-induced dot was created on the surface of $Sb_2S_3$ glass by slowly ramping the laser power density from 0 to 50 μW/μm² in 5 s, followed by steady exposure for 60 s, and its extension into a straight line by moving the laser spot at the speed of 1 μm/s.

In certain embodiments, the methods of the invention allow for laser-induced formation of $Sb_2S_3$ single crystal dot and line on the surface of $16SbI_3$-84 $Sb_2S_3$ glass. A single-crystal dot was created by slowly ramping the power density from 0 to 90 μW/μm² in 5 s, followed by steady exposure for 60 s. Dot was extend into a straight line by moving the laser spot at the speed of 20 μm/s with the power density 90 μW/μm².

Example 1

1-D Single Crystal Fabrication

Figure 2A:
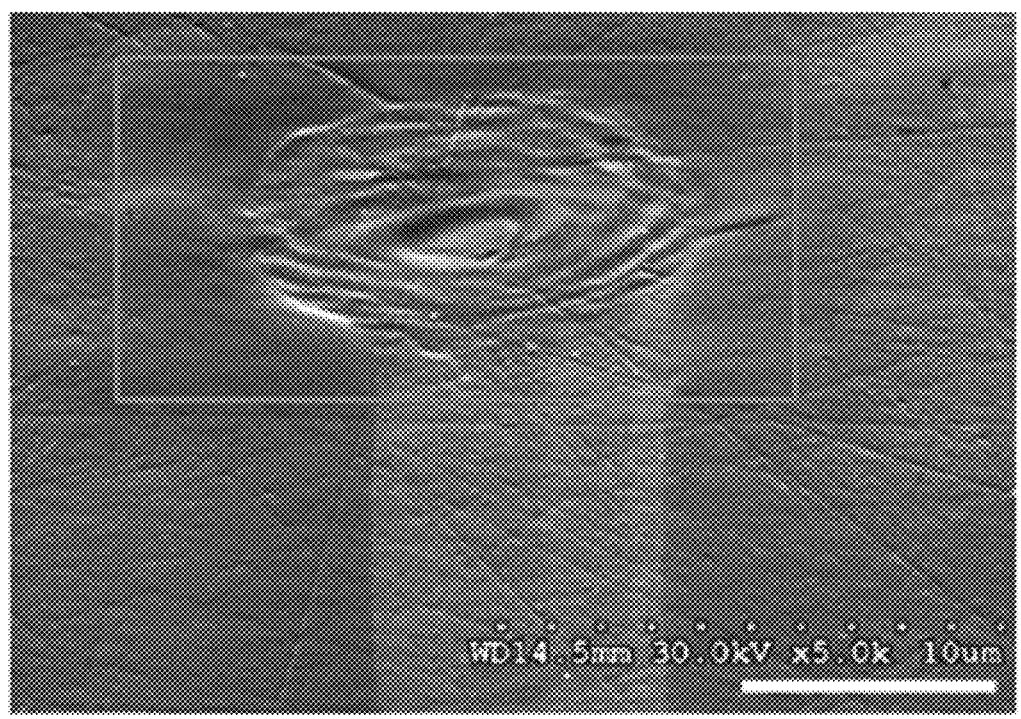
FIGS. 2A-2B comprise a series of images illustrating an exemplary laser-induced formation of $Sb_2S_3$ single crystal line on the surface of $Sb_2S_3$ glass. A laser-induced dot created on the surface of $Sb_2S_3$ glass by slowly ramping the laser power density from 0 to 50 $\mu W/\mu m^2$ in 5 s, followed by steady exposure for 60 s, and its extension into a straight line by moving the laser spot at the speed of 1 $\mu m/s$. Scale bar corresponds to 5 µm.
Figure 2B:
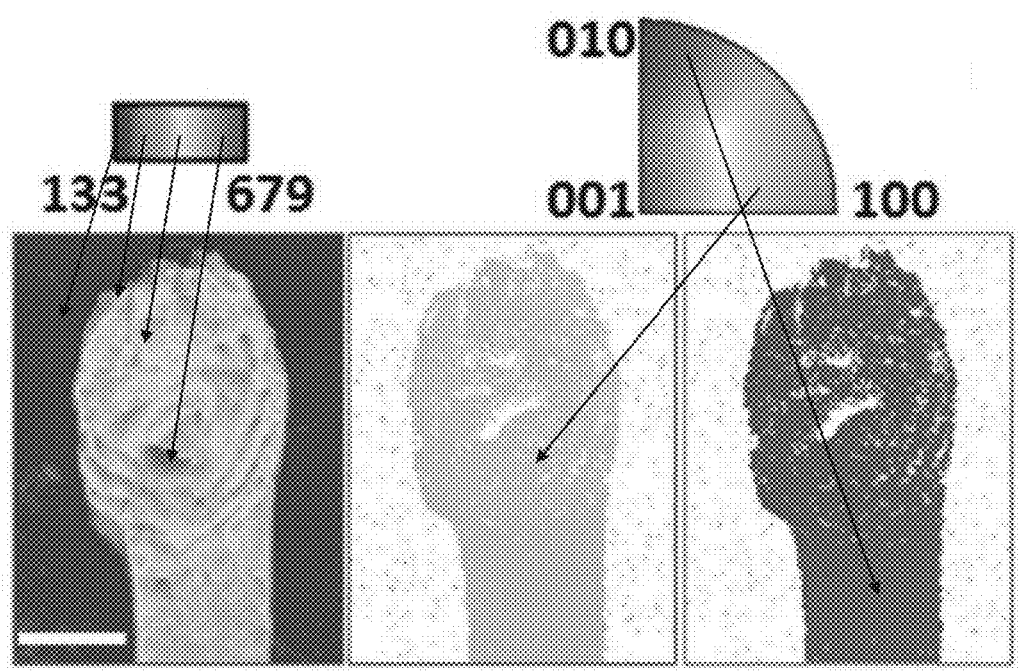

The success of the space selective laser-induced heating for transforming glass into single crystal is evident from the results shown in FIGS. 2A-2B, using the example of $Sb_2S_3$ glass. A diode laser with wavelength (λ) of 639 nm, which was focused to a few μm on the surface, was employed. The laser intensity was gradually increased from 0 to 50 μW/μm² in 5 s and then maintained at this value. The first sign of a crystal was observed 2 s thereafter. Within 20 s it reached the equilibrium dimensions as seen in FIGS. 2A-2B. The uniform color of inverse pole figure (IPF) maps obtained from electron backscatter diffraction (EBSD) analysis confirms that the $Sb_2S_3$ glass transformed into a single crystal dot by laser heating.

As the laser beam was subsequently moved laterally across the surface at a rate of 1 μm/s, the growth of the initial dot followed the laser, forming a single crystal line of $Sb_2S_3$ as seen in FIG. 2B. The orientation IPF maps for both the dot and line exhibited the same color, which confirms that the whole structure was a single crystal of $Sb_2S_3$ (FIG. 2B, center and right).

In order to extend the approach to other materials systems, unwanted nucleation was further suppressed by adding a glass-forming component. This additional strategy can have broad applicability through appropriate choice of glass composition. For its validation, the above experiments were repeated on homogeneous $16SbI_3$-$84Sb_2S_3$ glass, wherein the addition of 16% $SbI_3$ makes glass formation easier and nucleation more difficult relative to $Sb_2S_3$. Nevertheless, when heated with a laser beam, only $Sb_2S_3$ crystalline phase precipitated out either through the evaporation of $SbI_3$ in the heated zone or enrichment of the region around the growing crystal with iodine and antimony. In either case, nucleation in front of the growing crystal was suppressed relative to crystal growth. FIG. 3A illustrates typical morphology of the initial dot (D1), which was induced by laser beam above a minimum threshold intensity of 65 μW/μm². The energy dispersive spectroscopy (EDS) analysis maps (FIG. 3E) for this region showed deficiency of iodine, which indicates $SbI_3$ evaporation under sustained heating by the laser beam. This change in composition increased the concentration of $Sb_2S_3$ and stimulated the formation of its crystal in shallow crater. To assess the tendency of nucleation relative to the growth of $Sb_2S_3$ crystal in $16SbI_3$-84 $Sb_2S_3$ glass, the laser was turned off after forming the single crystal line L1. It took less than 1 s to form a new dot next to the previously formed line L1, compared to about 43 s needed to form the initial dot D1. Therefore, the crystal line can be grown indefinitely using the previously created crystal as a seed.

Example 2

2-D Single Crystal Fabrication

Having demonstrated the feasibility of solid glass-to-single crystal transformation and the ability to fabricate single crystal lines by eliminating extraneous nucleation, realization of 2D crystals was explored, further enhancing the usefulness of solid state crystal growth as a SCAG. Based on FIGS. 4A-4E, which illustrates a 2D crystal of $Sb_2S_3$ grown on the surface of $16SbI_3$-84 $Sb_2S_3$ glass, it is indeed possible to "stitch" successive lines together to form a 2D crystal.

In this approach, the laser was moved from the initial dot D1 in X-direction at 20 μm/s, and the first $Sb_2S_3$ single crystal, L1, grew without introducing additional nuclei. To obtain the second line, the end of first line is used as the seed. Laser exposure for the second and subsequent dots (D2-D7) was reduced to 15 s compared to 60 s for D1. Then the second line was written anti-parallel to and overlapping the first line. The subsequent laser-written crystal lines were written similarly, overlapping with the previous line by slightly more than half the width of the previous line. The result is a 2D planar single-crystal structure made via solid-solid transformation, with c-axis orientation normal to the laser scanning direction for the whole area as shown by the EBSD maps in FIGS. 4B-4E. Each crystal in these dots (D2-D7) and subsequent lines maintained the same orientation. The neighboring lines merged and formed the 2D single crystal structure. The reproducibility of the observations reported herein was excellent as established from experiments on a few tens of dots and lines, and several 2D structures using optimal laser irradiation parameters (such as but not limited to power, focus position relative to surface, and scanning rate).

The disclosures of each and every patent, patent application, and publication cited herein are hereby incorporated herein by reference in their entireties Although the invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed:

1. A method of growing a single crystal in a bulk glass material, the method comprising irradiating a first section of the bulk glass with a laser beam, wherein irradiating with the laser beam heats the first section of the bulk glass to about the bulk glass's crystallization onset temperature ($T_x$), and wherein bulk glass in the first section is converted to a single crystal.

2. The method of claim 1, wherein the first section of the bulk glass remains a solid while being irradiated with the laser beam.

3. The method of claim 1, wherein the bulk glass has at least one characteristic selected from the group consisting of: the bulk glass melts incongruently, the bulk glass comprises a component that preferentially evaporates at a temperature higher than $T_x$, and the bulk glass decomposes upon heating to its melting temperature ($T_m$).

4. The method of claim 1, wherein the single crystal is unstable at temperatures between $T_x$ and its melting temperature ($T_m$).

5. The method of claim 1, wherein the single crystal undergoes phase transformation at temperatures between $T_x$ and its melting temperature ($T_m$).

6. The method of claim 1, wherein the first section has a diameter that is selected so that only one single crystal is formed in the first section upon laser irradiation.

7. The method of claim 1, wherein the first section has a diameter ranging from about 0.5 µm to about 1 mm.

8. The method of claim 1, wherein the laser beam has a power density ranging from about 10 µW/µm$^2$ to about 1 W/µm$^2$.

9. The method of claim 1, wherein irradiation of the first section by the laser beam ceases as soon as the single crystal forms in the first section.

10. The method of claim 9, further wherein the position of the laser beam with respect to the bulk glass is changed, so that the laser beam irradiates a second section of the bulk glass, wherein the second section overlaps partially with the first section, wherein irradiating with the laser beam heats the second section to about the bulk glass's $T_x$, and wherein bulk glass in the second section is converted to a single crystal.

11. The method of claim 10, wherein a single crystal is formed in a sub-section that lies within the combination of the first and second sections.

12. The method of claim 1, wherein the laser beam penetrates the glass to a depth equal to or greater than 1 µm.

13. The method of claim 1, wherein the bulk glass comprises at least one selected from the group consisting of chalcogenide glasses, oxide glasses, metallic glasses, and thermoplastic polymers.

14. The method of claim 13, wherein the bulk glass comprises an $A_2B_3$ type chalcogenide, wherein 'A' comprises at least one selected from the group consisting of As, Sb and Bi, and 'B' comprises at least one selected from the group consisting of S, Se and Te.

15. The method of claim 14, wherein the bulk glass comprises $Sb_2S_3$.

16. The method of claim 13, wherein the bulk glass further comprises a glass-forming component.

17. The method of claim 16, wherein the glass-forming component comprises at least one selected from the group consisting of $SiO_2$, $B_2O_3$, $GeO_2$, $As_2S_3$, $GeS_2$, $GeSe_2$, $As_2Se_3$, and $SbI_3$.

18. A method of growing a two-dimensional single crystal in a bulk glass material, the method comprising:
(a) irradiating a first initial section of the bulk glass with a laser beam, wherein the irradiated first initial section heats to about the bulk glass's crystallization onset temperature ($T_x$), whereby a single crystal is formed in the first initial section;
(b) reorienting the laser beam in relation to the bulk glass, so that the laser irradiates a first final section of the glass, whereby in between irradiating the first initial and first final sections the laser sequentially irradiates a first plurality of intermediate sections of the bulk glass, wherein:
each of the first plurality of intermediate sections is irradiated with the laser beam so that it is heated to about the bulk glass's $T_x$, wherein bulk glass in each of the first plurality of intermediate sections is converted to a single crystal,
each of the first plurality of intermediate sections independently partially overlaps with the intermediate section that immediately precedes and the intermediate section that immediately succeeds it in the first plurality of intermediate sections,
the last section in the first plurality of intermediate sections overlaps with the first final section, and
a single crystal is formed in a first sub-section comprised within the combination of the first initial section, each of the first plurality of intermediate sections and first final section of bulk glass;
(c) reorienting the laser beam in relation to the bulk glass, so that the laser irradiates a second final section of the bulk glass, whereby in between irradiating the first final and second final sections the laser sequentially irradiates a second plurality of intermediate sections of the bulk glass, wherein:
each of the second plurality of intermediate sections is irradiated with the laser beam so that it is heated to about the bulk glass's $T_x$, wherein bulk glass in each of the second plurality of intermediate sections is converted to a single crystal,
each of the second plurality of intermediate sections independently partially overlaps with the intermediate section that immediately precedes and the intermediate section that immediately succeeds it in the second plurality of intermediate sections, the last section in the second plurality of intermediate sections overlaps with the second final section, and a single crystal is formed in a second sub-section comprised within the combination of the first final section, each of second plurality of intermediate sections and second final section of bulk glass;

wherein at least one of the first plurality of intermediate sections overlaps with at least one of the second plurality of intermediate sections, and wherein the first sub-section overlaps partially with the second sub-section;

whereby a two-dimensional single crystal is formed in the bulk glass.

19. The method of claim 18, wherein the two-dimensional single crystal spans on the bulk glass a continuous surface that is substantially free of non-crystalline material.

20. The method of claim 1, wherein said bulk glass material is made by heating materials capable of forming bulk glass to a first temperature above a melting temperature of those materials to melt those materials, and cooling the melted materials to a second temperature below the melting temperature of those materials to form the bulk glass material.

21. The method of claim 1, wherein said bulk glass material is a non-crystalline solid in which the short range order of an atomic structure of the material in melted form is equal to the short range order of the material in solid form.

22. The method of claim 18, wherein said bulk glass material is made by heating materials capable of forming bulk glass to a first temperature above a melting temperature of those materials to melt those materials, and cooling the melted materials to a second temperature below the melting temperature of those materials to form the bulk glass material.

23. The method of claim 18, wherein said bulk glass material is a non-crystalline solid in which the short range order of an atomic structure of the material in melted form is equal to the short range order of the material in solid form.

* * * * *